(12) United States Patent
Hourdequin et al.

(10) Patent No.: US 7,007,051 B2
(45) Date of Patent: Feb. 28, 2006

(54) DEVICES CONTAINING LOGIC CIRCUITS TO GENERATE RANDOM SIGNALS

(75) Inventors: Marc Hourdequin, Luille (FR);
Christian Lagorce, Pance (FR);
Laurent Malaquin, Chavagne (FR)

(73) Assignee: Delegation Generale pour l'Armement, Armees (FR)

( * ) Notice: Subject to any disclaimer, the term of this patent is extended or adjusted under 35 U.S.C. 154(b) by 577 days.

(21) Appl. No.: 09/891,499

(22) Filed: Jun. 27, 2001

(65) Prior Publication Data

US 2002/0083105 A1    Jun. 27, 2002

(30) Foreign Application Priority Data

Jun. 27, 2000    (FR) .................................. 00 08241

(51) Int. Cl.
*G06F 1/02*    (2006.01)
(52) U.S. Cl. ...................... 708/250; 708/251
(58) Field of Classification Search ......... 708/250–257
See application file for complete search history.

(56) References Cited

U.S. PATENT DOCUMENTS

| | | | |
|---|---|---|---|
| 5,961,577 A | | 10/1999 | Soenen et al. |
| 5,963,104 A | * | 10/1999 | Buer .......................... 331/78 |
| 6,480,072 B1 | * | 11/2002 | Walsh et al. ................. 331/78 |

OTHER PUBLICATIONS

Petrie C.S., et al. "Modeling and Simulation of Oscillator-based Random Number Generators," May 12, 1996, pp. 324-327.
Castanie F. "Generation of Random Bits with Accurate and Reproducible Statistical Properties," Jul. 1, 1978, pp. 807-809.

* cited by examiner

*Primary Examiner*—Chuong D. Ngo
(74) *Attorney, Agent, or Firm*—Steptoe & Johnson LLP

(57) ABSTRACT

A device including an oscillator circuit having semiconducting logic elements and switching means for controlling warming and cooling of the circuit and, in that process, causing it to heat or cool in order to generate a random signal at the output of the logic elements. A plurality of devices are for continuously generating random signals, and control elements are for controlling in alternating manner the warming and cooling of the devices.

11 Claims, 2 Drawing Sheets

DEVICES CONTAINING LOGIC CIRCUITS TO GENERATE RANDOM SIGNALS

FIELD OF THE INVENTION

The present invention relates to random-signal generating devices.

The invention advantageously applies, but is not limited, to random-signal generating devices based on logic circuits.

BRIEF SUMMARY OF THE INVENTION

A general objective of the invention is a device to generate high-quality random signals.

Already many logic devices to generate random signals are known such as combinations of asynchronous clocks or using the position at the time a voltage was applied to a bitmap memory. Under some conditions, the random nature of such devices may be assumed by default and as a result they are unsuited for many applications wherein randomness quality is critical, for instance when encrypting data.

Where high-grade randomness is desired, the electronic-circuit designers typically will use analog systems such a background-noise amplifiers. Such solutions however cannot be used in logic circuits, in particular as regards ASIC's or FPGA's. Incorporation therefore is precluded because a device specific to the required function is needed.

Another objective of the invention is to offer a solution implemented by logic circuits.

It is known that electronic noise is divided into two main sorts, namely thermal noise and shot noise, which the expert also dubs "popcorn noise" to describe the volatility of a rapidly varying signal mean level.

The objective of the invention is based on thermal noise and to AND, OR or XOR it with the junction noise of the semiconductors.

In particular the present invention proposes a random-signal generating device which is characterized in that it comprises a transient-state electronic circuit and also means to control "operation" and/or "shutdow" of said circuit in order to generate a random signal at said circuit's output.

Such transient state circuit will heat or cool depending on being operational or shut off. Its heating generates a random signal.

Advantageously but without implying restriction, the circuit comprises semiconducting logic elements.

In a preferred embodiment in particular, said device comprises an oscillator circuit based on semiconductors and means to operate and/or shut off said circuit.

In such an oscillator, the thermal noise and the junction noise will amplify each other during heating, in particular when starting the device. The carrier speeds at the junctions depend on the temperature; this temperature increases when the carriers are being transferred. There is a self-amplification of the instability until the device is thermally stabilized—that is, when the heat removed equals the heat generated. The instability lasts only a very short time, which is the time required for the junction to pass from the ambient temperature to the stable temperature. This time interval ranges from about a hundred micro-seconds to no more than about a millisecond in prototype circuits, in particular 0.8 micron CMOS'. This parameter depends on the given technology.

Advantageously, the oscillator output is fed back to its input.

Closing the loop on the circuit amplifies the instability phenomena at the uncontrolled circuit output. In this manner the circuit amplifies its own instability and maintains it as long as possible.

In a preferred embodiment, the oscillator circuit comprises both inverting means to invert the input signal at its output signal and a loop between its output and input.

Appropriate means to control the operation or the shutdown of the oscillator circuit in particular may include switching elements situated in the loop between the inverting means and the output of the oscillator circuit.

The inverting means may comprise an odd-numbered plurality of inverter elements.

Also the phenomenon exploited in the manner of the invention being ephemeral, a continuous stream shall be attained by coupling at least two devices, one implementing instability while the other is cooling.

Accordingly another object of the invention is a device containing logic circuits to generate random signals and characterized in that, in order to continuously generate this random signal, said device includes several elements, further means which consecutively and alternatingly control the operation and then the shutoff of the transient state circuits of each element, further means to AND, OR or XOR the outputs of the various elements.

Advantageously logic AND, OR or XOR elements implement a combination of the EXCLUSIVE OR type at the outputs of the various elements.

Preferably the control means include at least one counter of which the input receives the output signal from the sub-assembly ANDing, ORing or XORing the various element outputs and furthermore means controlling the operation and/or the shutdown of the semiconducting implements of said elements as a function of the said counter's countdown.

It is understood that the devices proposed by the present invention advantageously will be integrated into a specific circuit or in a programmable one (ASIC or FPGA).

BRIEF DESCRIPTION OF THE DRAWINGS

Other features and advantages of the invention are elucidated in the illustrative and non-limiting description below and in relation to the attached drawings.

DESCRIPTION OF THE PREFERRED EMBODIMENTS

Figure 1:
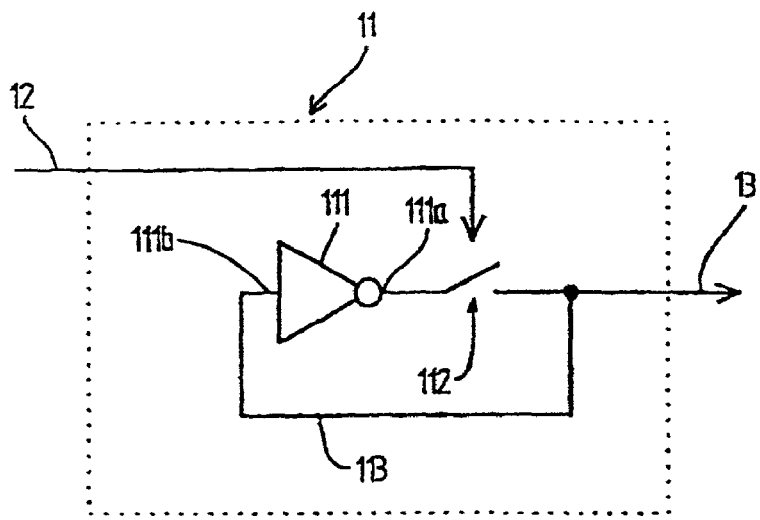
FIG. 1 is a functional block diagram of a logic-circuit device of one embodiment of the present invention.

The circuit 11 shown in an illustrative embodiment of the present invention includes one inverter 111, or an odd number of such inverters, and is applied as a loop through a logic gate 112.

This gate constitutes a switching element allowing or blocking full feedback and is controlled by an external signal 12.

Until the circuit 11 is thermally stable, its output 13 is random (substantially in frequency) once the control 12 allows feedback. This randomness is pronounced and may be exploited till the circuit is thermally stable.

Figure 2:
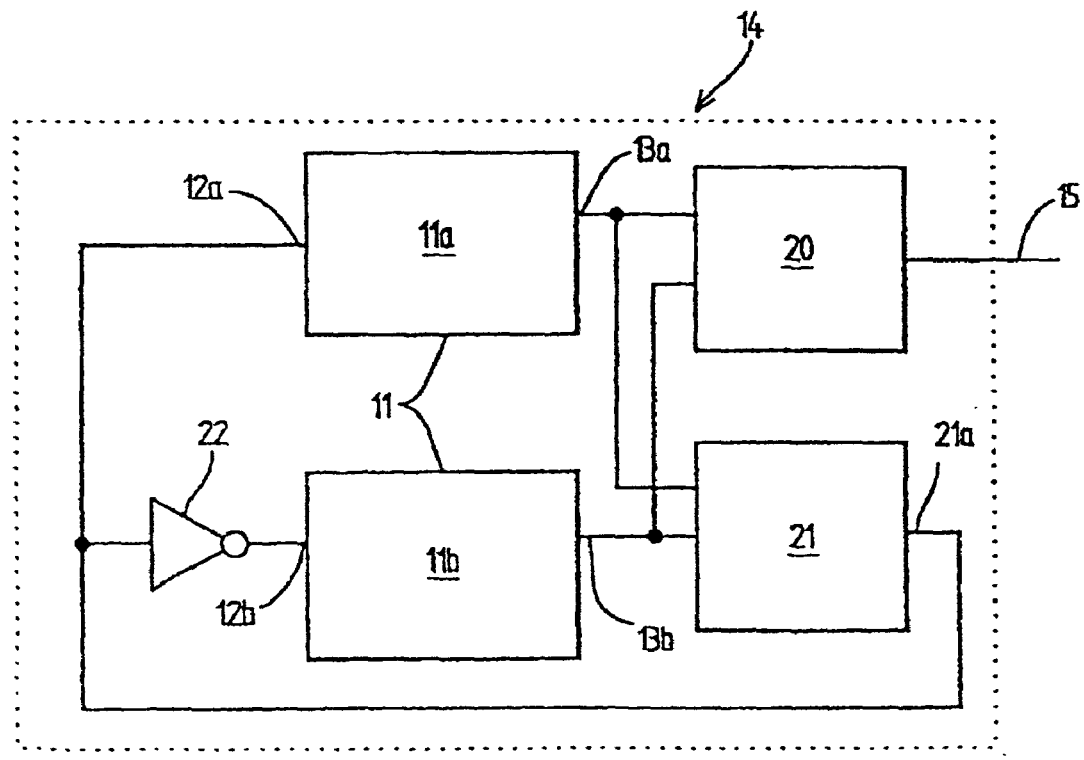
FIG. 2 is a functional block diagram of a continuous stream device of one embodiment of the present invention.

The design of FIG. 2 allows continuously generating a random signal.

The device 14 shown in FIG. 2 comprises several circuits of the sort shown in FIG. 1, in this case two circuits denoted by 11a and 11b. For the sake of simplicity of exposition, the number of circuits is kept low but obviously also may be larger. The inventors ran tests on devices fitted with up to five circuits of the kind shown in FIG. 1.

The means controlling the circuits 11a, 11b are such that only one of said circuits is operated at a time.

The outputs 13a, 13b are ANDed, ORed or XORed in elements 20 to generate a single output signal (output 15).

The elements implement logic combinations 20 AND OR or XOR on the outputs 13a, 13b and consist of an XOR (exclusive OR) circuit allowing to get rid of the state 0 or 1 of the stable circuit.

Moreover an XOR output feeds a counter 21 which counts down according to a selected modulus. This modulus is selected as large as possible, though not being excessive, in order that the countdown time always shall be less than the thermal stabilization time.

In this instance and as shown in FIG. 2, the device 21 incorporates both counting means and an XOR circuit upstream of said means.

The high-order bit at the output 21a of the counter 21 controls the logic gates of the circuits 11a, 11b. This bit 21a is directly fed to one of the circuits and will be inverted before being fed to the other. In this instance the signal 21a directly constitutes the signal 12a driving the circuit 11a. Said signal 21a is inverted by an inverter 22 in order to constitute the signal 12b which constitutes the circuit 11b.

The invention described above relates to a specific design of a logic oscillator but is applicable more generally to any device fitted with semiconducting means and even more broadly it relates to any device comprising a transient-state electronic circuit. In the course of heating or cooling, per se or through the intermediary of another agent such as nearby circuits, such means exhibit an instability which is reflected in a random change of the combination-recombination rate of the carriers to affect many parameters, namely propagation time, rise and fall of the signals, fan-out etc. Heat is produced by combinations-recombinations.

The invention also may be applied to analog-circuit configurations.

Figure 3:
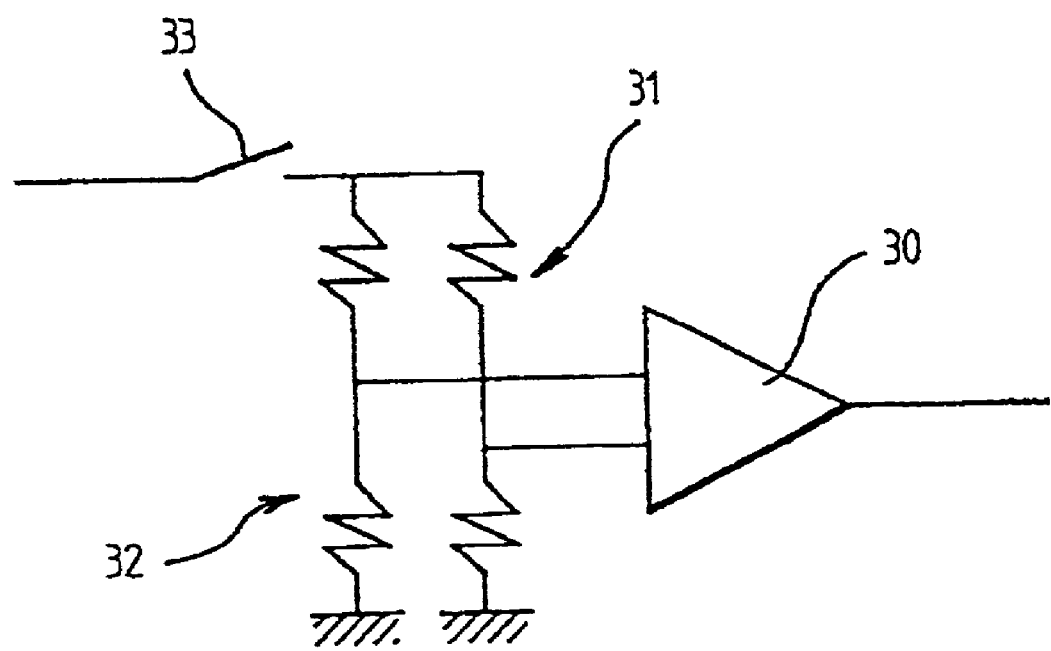
FIG. 3 is an analog circuit diagram illustrating another device embodiment of the present invention.

A configuration of this kind is shown in FIG. 3 showing an analog circuit comprising a differential amplifier 30 and two identical voltage-dividing bridges 31, 32 of which the outputs are applied to a respective input of the amplifier 30. A switch 33 controls the voltage to these two voltage-dividing bridges 31, 32.

When the resistances of the dividing bridges 31, 32 are heated, a voltage differential is present across the outputs of the two dividing bridges and this is a random signal which may be exploited thanks to the differential amplifier 30.

Nevertheless the designs involving semiconducting logic circuits are preferred.

In the latter case the device shall be advantageously relate to an FPGA or ASIC circuit. The inventors tested the invention using an ACTEL 1010.

In the case of using an ASIC, the randomness generator(s) advantageously shall be situated in zones exhibiting the least synchronous possible electric activities.

What is claimed is:

1. A device for generating a random signal, comprising:
   a transient-state electronic circuit having an output terminal; and
   means for generating thermal instability in said circuit by enabling and disabling said circuit;
   wherein said random signal is generated at said output terminal in response to thermal instability generated in said circuit.

2. The device of claim 1, wherein the circuit comprises semiconductor logic elements.

3. The device of claim 2, wherein said transient-state circuit comprises an oscillator circuit comprising semiconductor elements and means for controlling warming and cooling of said oscillator circuit.

4. The device of claim 3, wherein said oscillator circuit comprises an oscillator input terminal connected to an oscillator output terminal for looping an output signal from the oscillator output terminal to the oscillator input terminal.

5. The device of claim 4, wherein said oscillator circuit comprises an inverter means having an inverter input terminal connected by a circuit to an inverter output terminal, said inverting means for inverting a signal applied to said inverter input terminal and outputting said inverted signal at said inverter output terminal, wherein said inverter means comprises a switch located in said circuit, said switch for breaking the circuit between the inverter input and output terminals.

6. The device of claim 5, wherein said means for controlling warming and cooling of the oscillator circuit comprises switching means for breaking the circuit connecting the inverter output terminal to the oscillator output terminal.

7. The device of claim 5, wherein said inverter means comprises an odd number plurality of inverter means.

8. The device as claimed in claim 1, in combination with a specific integrated circuit or a programmable integrated circuit.

9. A device comprising at least one logic circuit for generating a random signal, the device comprising:
   a plurality of random signal generating devices each comprising a transient-state electronic circuit comprising semiconductor logic devices and having an output terminal and control means for controlling warming and cooling of said transient-state circuit, said plurality of devices for continuously generating a random signal;
   control elements for consecutively and alternatingly controlling warming and cooling of the transient-state circuit of each of said random signal generating device; and
   a combining element for combining output signals from said random signal generating devices.

10. The device of claim 9, wherein said combining element comprises an EXCLUSIVE OR gate.

11. The device of claim 10, wherein the control means for controlling the transient-state circuit comprises at least one counter for performing a countdown sequence, and having an input terminal for receiving an output signal from the combining element, which is for in turn ANDing, ORing or XORing the output signals from the random signal generating devices, said device further comprising means for controlling shutdown of the semiconductor elements of said plurality of random signal generating devices as a function of the countdown sequence.

\* \* \* \* \*